(12) United States Patent
Hayashi et al.

(10) Patent No.: US 9,204,545 B2
(45) Date of Patent: Dec. 1, 2015

(54) MULTILAYER SUBSTRATE

(71) Applicant: Murata Manufacturing Co., Ltd., Kyoto (JP)

(72) Inventors: Shigetoshi Hayashi, Kyoto (JP); Tomoya Yokoyama, Kyoto (JP); Takako Sato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/526,698

(22) Filed: Oct. 29, 2014

(65) Prior Publication Data

US 2015/0053467 A1      Feb. 26, 2015

Related U.S. Application Data

(63) Continuation of application No. PCT/JP2013/064579, filed on May 27, 2013.

(30) Foreign Application Priority Data

Jul. 31, 2012   (JP) .................................. 2012-170067

(51) Int. Cl.
*H05K 1/11*       (2006.01)
*H05K 1/03*       (2006.01)
(Continued)

(52) U.S. Cl.
CPC ................ *H05K 1/112* (2013.01); *H01L 23/15* (2013.01); *H01L 23/49805* (2013.01); *H01L 23/49822* (2013.01); *H05K 1/0271* (2013.01); *H05K 1/0298* (2013.01); *H05K 1/0306* (2013.01); *H05K 1/092* (2013.01); *H05K 1/113* (2013.01);
(Continued)

(58) Field of Classification Search
CPC ..... H05K 1/0306; H05K 1/111; H05K 1/112; H05K 1/113; H05K 1/114
See application file for complete search history.

(56) References Cited

U.S. PATENT DOCUMENTS 6,187,418 B1    2/2001   Fasano
2008/0164053 A1  7/2008   Matsubara

FOREIGN PATENT DOCUMENTS

JP    2001-068857 A    3/2001
JP    2002-009444 A    1/2002
(Continued)

OTHER PUBLICATIONS

International Search Report issued in Application No. PCT/JP2013/064579 dated Aug. 27, 2013.
Written Opinion issued in Application No. PCT/JP2013/064579 dated Aug. 27, 2013.
(Continued)

*Primary Examiner* — Jeremy C Norris
(74) *Attorney, Agent, or Firm* — Pearne & Gordon LLP

(57) ABSTRACT

Provided is a multilayer substrate that can prevent generation of cracks caused by stress generated due to a difference between the coefficient of linear expansion of electrode pads and that of a ceramic material. An electrode pad arranged on a layer below an outermost component mounting electrode pad has a larger area than an area of the component mounting electrode pad. Similarly, an electrode pad arranged on a layer below a component mounting electrode pad has a larger area than an area of the component mounting electrode pad, an electrode pad arranged on a layer below a component mounting electrode pad has a larger area than an area of the component mounting electrode pad, and an electrode pad arranged on a layer below a component mounting electrode pad has a larger area than an area of the component mounting electrode pad.

11 Claims, 6 Drawing Sheets

(51) Int. Cl.
  *H01L 23/15*    (2006.01)
  *H01L 23/498*   (2006.01)
  *H05K 1/02*     (2006.01)
  *H05K 1/09*     (2006.01)
  *H01L 23/13*    (2006.01)

(52) U.S. Cl.
  CPC ........... *H01L 23/13* (2013.01); *H01L 23/49838* (2013.01); *H01L 2224/16225* (2013.01); *H01L 2924/1531* (2013.01); *H01L 2924/15162* (2013.01); *H01L 2924/19105* (2013.01)

(56) References Cited

FOREIGN PATENT DOCUMENTS

| | | |
|---|---|---|
| JP | 2007-173650 A | 7/2007 |
| JP | 2008-177516 A | 7/2008 |
| JP | 2011-258607 A | 12/2011 |
| WO | 2007/026455 A1 | 3/2007 |
| WO | 2008/087781 A1 | 7/2008 |

OTHER PUBLICATIONS

Office Action issued in corresponding Japanese Application No. 2014-528028 dated Sep. 30, 2014.

MULTILAYER SUBSTRATE

BACKGROUND OF THE INVENTION

1. Field of the Invention

The present invention relates to a multilayer substrate formed by stacking a plurality of ceramic green sheets.

2. Description of the Related Art

To date, there are known examples of a DC-DC converter realized by forming a coil pattern within a multilayer substrate formed by stacking a plurality of ceramic green sheets, and by mounting electronic components, such as a control IC, on the top surface of the multilayer substrate (refer to, for example, Patent Document 1).

Patent Document 1: International Publication No. 2008/087781.

BRIEF SUMMARY OF THE INVENTION

Electrode pads for mounting the electronic components described above are formed on the top surface of a multilayer substrate. At the time of firing, cracks may be generated as a result of stress generated due to a difference between the coefficient of linear expansion of the electrode pads and that of the ceramic. Since the cracks are generated at the end portions of the electrode pads, when water penetrates from the end portions into the inside, this may cause a short-circuit failure. Hence, to date, processing for covering the end portions of the electrode pads with ceramic paste has been performed in some cases.

It is an object of the present invention to provide a multilayer substrate that prevents the generation of cracks described above.

A multilayer substrate according to the present invention includes: a plurality of ceramic green sheets; via holes formed by filling through-holes provided in the ceramic green sheets with conductive paste; and electrode pads formed on the plurality of ceramic green sheets. The multilayer substrate is formed by stacking the plurality of green sheets on top of one another and by firing the plurality of green sheets together in a state in which some of the electrode pads are electrically connected to one another through some of the via holes, and among the electrode pads electrically connected to one another through some of the via holes, an electrode pad provided on an outermost layer of the multilayer substrate has an area different from an area of an electrode pad provided on an inner layer of the multilayer substrate.

Stress generated due to the difference between the coefficient of linear expansion of the electrode pads and that of a ceramic concentrates near the end portions of the electrode pads. Hence, in the multilayer substrate of the present invention, by making the outermost electrode pad have an area different from an area of the inner layer electrode, the end portions of the electrode pads are positioned apart from each other, thereby dispersing the positions at which the stress concentrates and preventing stress from concentrating at a single location. With this configuration, stress generated in the outermost ceramic sheet is alleviated and generation of cracks is prevented, more than in the case where an electrode pad on the outermost layer has an area which is the same as that of a corresponding electrode pad on an inner layer.

The area of the electrode pad on the inner layer may be larger or smaller than the area of the electrode pad on the outermost layer.

In the case where a plurality of electrode pads are provided on the inner layer, it is preferable that at least an electrode pad provided on one of the inner layers have an area that is different from an area of the electrode pad provided on the outermost layer.

In the case where the multilayer substrate is an electronic component module, the electrode pad provided on the outermost layer of the multilayer substrate may be a mounting electrode to be connected to a mounting-substrate-side land electrode or the like to which the electronic component module is to be mounted, or may be an electrode for mounting an electronic component, such as a control IC.

Note that although the ceramic green sheets may be made of a dielectric material, a ferrite material, or the like, a ferrite material, in particular, is rigid and cracks are likely to be generated. Hence, the multilayer substrate of the present invention is advantageous in the case where the outermost ceramic green sheet is made of a ferrite material.

According to the present invention, generation of cracks caused by stress generated due to the difference between the coefficient of linear expansion of the electrode pads and that of a ceramic is prevented.

DETAILED DESCRIPTION OF THE INVENTION

Figure 1A:
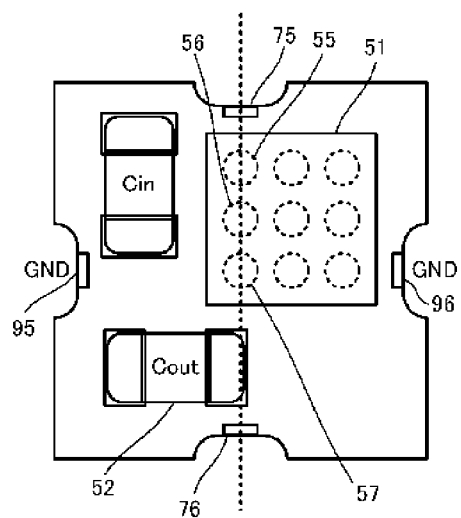
FIGS. 1A-1C are plan views of a DC-DC converter.
Figure 1B:
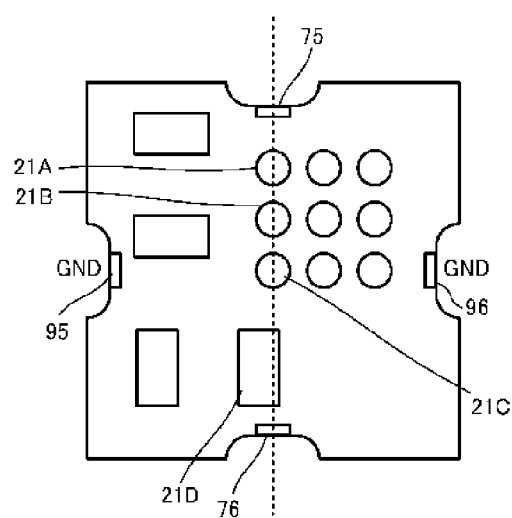
Figure 1C:
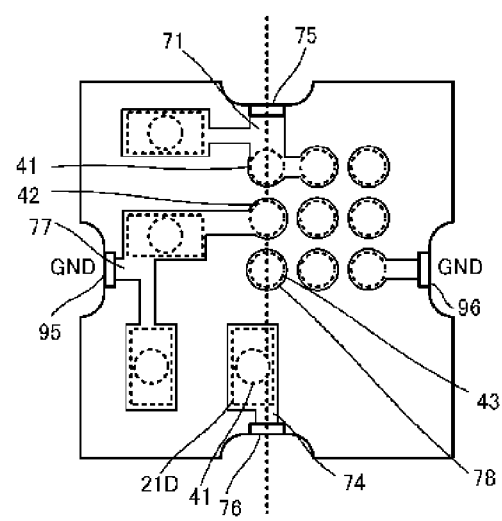
Figure 2:
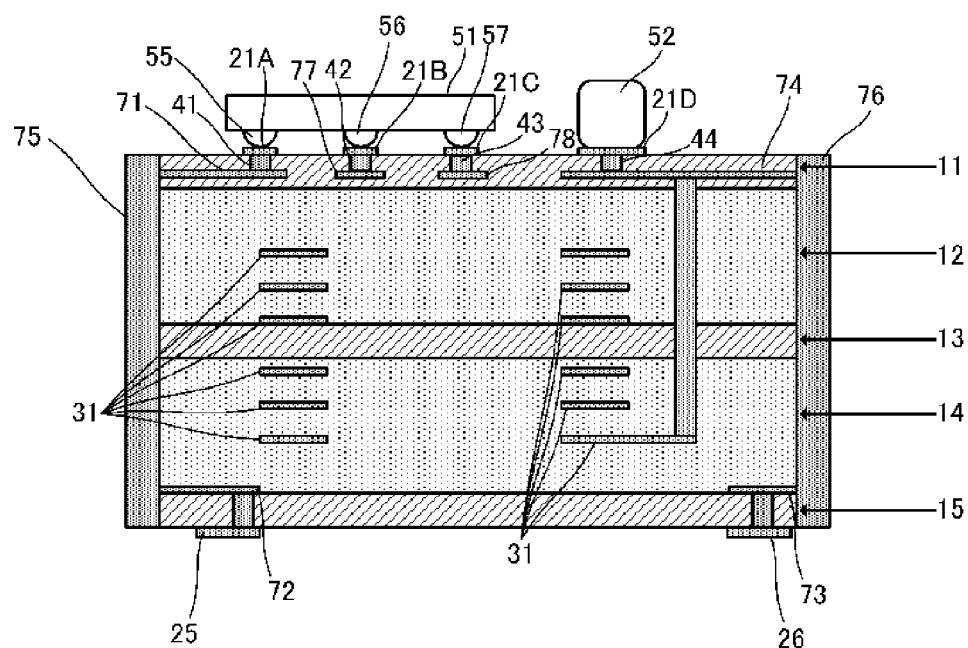
FIG. 2 is a vertical cross-sectional view of the DC-DC converter.

FIG. 1A is a plan view of a DC-DC converter module including a multilayer substrate according to the present invention, FIG. 1B is a plan view of the outermost layer (first layer) in which mounted components have been omitted, and FIG. 1C is a plan view of a layer (second layer) below the first layer. FIG. 2 is a diagram schematically illustrating the vertical cross-sectional structure of the DC-DC converter module.

The multilayer substrate is formed of a multilayer body in which a plurality of ceramic green sheets are stacked on top of one another. In the multilayer substrate, a non-magnetic ferrite layer 11, a magnetic ferrite layer 12, a non-magnetic ferrite layer 13, a magnetic ferrite layer 14, and a non-magnetic ferrite layer 15 are arranged in this order from the top surface to the bottom surface of the outermost layers.

A plurality of electrode pads for mounting components are formed on the uppermost surface of the multilayer substrate in the substrate stacking direction. In FIGS. 1A-1C and FIG. 2, a component mounting electrode pad 21A connected to the input terminal of a control IC 51, a component mounting electrode pad 21B connected to the ground terminal of the control IC 51, a component mounting electrode pad 21C connected to the output terminal of the control IC 51, and a component mounting electrode pad 21D connected to the terminal of an output-side capacitor 52 are illustrated.

Various electrode pads which are to be connected to mounting-substrate-side land electrodes or the like to which the DC-DC converter is to be mounted are formed on the lowermost surface of the multilayer substrate in the substrate stacking direction. In FIG. 2, an input electrode pad 25 and an output electrode pad 26 are illustrated.

An edge surface through-hole 75, an edge surface through-hole 76, an edge surface through-hole 95, and an edge surface through-hole 96 are formed on the edge surfaces of the multilayer substrate from the top surface to the bottom surface. The edge surface through-hole 75 is used to electrically connect the component mounting electrode pad 21A on the uppermost surface to the input electrode pad 25 on the lowermost surface, and the edge surface through-hole 76 is used to electrically connect the component mounting electrode pad 21D on the uppermost surface to the output electrode pad 26 on the lowermost surface. The edge surface through-hole 95 and the edge surface through-hole 96 are used to electrically connect the various electrode pads (for example, the component mounting electrode pad 21B) on the uppermost surface to ground electrode pads (not illustrated) on the lowermost surface.

Various electrode pads for wiring are formed on some of the ceramic green sheets arranged on the inner layers of the multilayer substrate. For example, as illustrated in FIG. 1C, an electrode pad 71 for electrically connecting the edge surface through-hole 75 to an input side capacitor and the input terminal of the control IC 51, an electrode pad 74 for electrically connecting the edge surface through-hole 76 to an output capacitor, and an electrode pad 77 for connecting the ground terminals of various electronic components to the edge surface through-hole 95 are formed on a second layer. An electrode pad 72 for electrically connecting the edge surface through-hole 75 to the input electrode pad 25, and an electrode pad 73 for electrically connecting the edge surface through-hole 76 to the output electrode pad 26 are formed on the lowermost surface.

The electrode pads are connected to one another by interlayer connection using via holes. The via holes are formed by providing through-holes in the ceramic green sheets and filling the through-holes with conductive paste. For example, the component mounting electrode pad 21A and the electrode pad 71 are electrically connected to each other through a via hole 41, the component mounting electrode pad 21B and the electrode pad 77 are electrically connected to each other through a via hole 42, the component mounting electrode pad 21C and an electrode pad 78 are electrically connected to each other through a via hole 43, and the component mounting electrode pad 21D and the electrode pad 74 are electrically connected to each other through a via hole 44.

An input terminal 55 of the control IC 51 is connected to the input electrode pad 25 through various wiring lines, such as the component mounting electrode pad 21A, the via hole 41, the electrode pad 71, the edge surface through-hole 75, and the electrode pad 72.

A ground terminal 56 of the control IC 51 is connected to a ground electrode, which is not illustrated, through various wiring lines, such as the component mounting electrode pad 21B, the via hole 42, the electrode pad 77, and the edge surface through-hole 95.

An output terminal 57 of the control IC 51 is connected to the output electrode pad 26 through various wiring lines, such as the component mounting electrode pad 21C, the via hole 43, and the electrode pad 78.

Electrode patterns 31 formed on some of the ceramic green sheets arranged deeper within the multilayer substrate are connected to each other by interlayer connection using via holes, thereby forming a helical shape with the magnetic ferrite layer 12, the non-magnetic ferrite layer 13, and the magnetic ferrite layer 14 arranged between the electrode patterns 31 to produce a coil conductor. The multilayer substrate functions as an inductor, and functions as a DC-DC converter module as a result of electronic components such as the control IC 51 and various capacitors being mounted thereon.

In the case of a step down DC-DC converter, the electrode patterns 31 functioning as an inductor are connected to the output terminal 57 of the control IC 51. The output side of the electrode patterns 31 is connected to the output-side capacitor 52, and the output-side capacitor 52 and the output side of the electrode patterns 31 are connected to the output electrode pad 26 through various wiring lines, such as the component mounting electrode pad 21D, the electrode pad 74, the edge surface through-hole 76, and the electrode pad 73.

Note that the non-magnetic ferrite layer 13, which is an intermediate layer, functions magnetically to create a state equivalent to the case in which a space exists between the magnetic ferrite layer 12 and the magnetic ferrite layer 14, and enhances the DC superimposition characteristics as an inductor. However, this is not an essential element of the present invention.

The non-magnetic ferrite layer 11 and the non-magnetic ferrite layer 15 on the outermost layers have the function of respectively covering the upper surface of the magnetic ferrite layer 12 and the lower surface of the magnetic ferrite layer 14. Further, these layers are provided to increase the strength of the device by making the magnetic ferrite layer 12 and the magnetic ferrite layer 14 which have a relatively high thermal contraction rate be sandwiched between the non-magnetic ferrite layer 11 and the non-magnetic ferrite layer 15 having a relatively low thermal contraction rate and by compressing the whole device through firing. However, the non-magnetic ferrite layer 11 and the non-magnetic ferrite layer 15 are not essential elements of the present invention.

Materials having different thermal contraction rates, such as ceramic green sheets and various wiring lines, exist in the multilayer substrate. In general, a metal material has a larger coefficient of linear expansion than a coefficient of linear expansion of a ceramic material and, hence, there is a tendency for an electrode pad to shrink more than a ceramic material at the time of firing. Hence, at the time of firing, stress caused by this difference in the coefficient of linear expansion is generated in the ceramic green sheets (in particular, in the outermost non-magnetic ferrite layer 11). Stress generated due to the difference in the coefficient of linear expansion between the electrode pads and the ceramic sheets concentrates near the end portions of the electrode pads. In the case where the electrode pad at the outermost layer has an area same as an area of the corresponding electrode pad at an inner layer, the end portions of these electrode pads are located at positions nearest to each other and, hence, stress concentrates even more at the end portions, whereby cracks may be generated in the outermost ceramic green sheet.

Hence, in the multilayer substrate of the present invention, by making the outermost electrode pad have an area different form an area of the corresponding inner layer electrode pad, the end portions of the electrode pads are positioned apart from each other, such that the positions at which the stress concentrates are dispersed, thereby preventing the stress from concentrating at a single location.

In other words, the electrode pad 71 arranged on a layer below the outermost component mounting electrode pad 21A has a larger area than an area of the component mounting electrode pad 21A. Similarly, the electrode pad 77 arranged on a layer below the component mounting electrode pad 21B has a larger area than an area of the component mounting electrode pad 21B, the electrode pad 78 arranged on a layer below the component mounting electrode pad 21C has a larger area than an area of the component mounting electrode pad 21C, and the electrode pad 74 arranged on a layer below the component mounting electrode pad 21D has a larger area than an area of the component mounting electrode pad 21D.

With this configuration, stress generated in the outermost ceramic sheet is alleviated and generation of cracks is prevented, more than in the case where electrode pads on the outermost layer have the same areas as areas of corresponding electrode pads on an inner layer.

Figure 3:
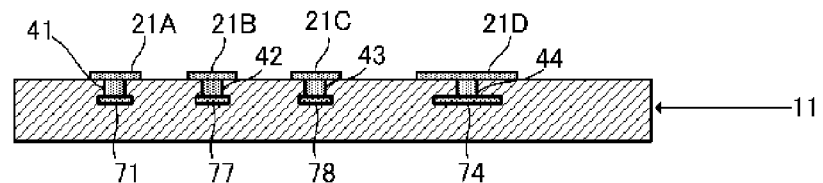
FIG. 3 is a diagram illustrating an example in which the area of an electrode pad arranged on a lower layer is small.

Note that electrode pads arranged on a lower layer may have smaller areas than areas of corresponding electrode pads on the outermost layer, as illustrated in FIG. 3.

When there exist a plurality of electrode pads on lower layers, it is only required that at least an electrode pad provided on one of the lower layers have an area that is different from the area of a corresponding electrode pad on the outermost layer. FIGS. 4A-4D and FIG. 5 are diagrams illustrating a DC-DC converter in the case where electrode pads are provided on a further-lower layer.

Figure 4:
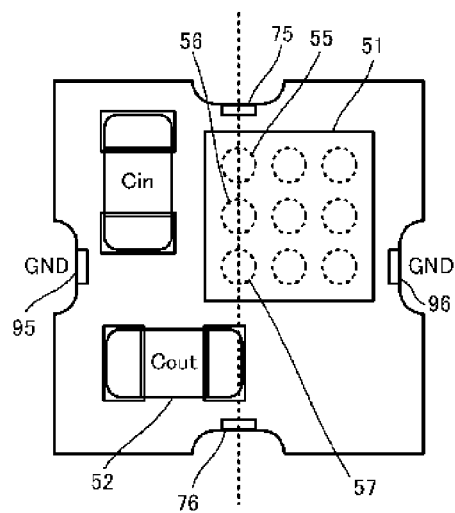
FIGS. 4A-4D are plan views of a DC-DC converter in the case where electrode pads are provided on a further-lower layer.
Figure 4:
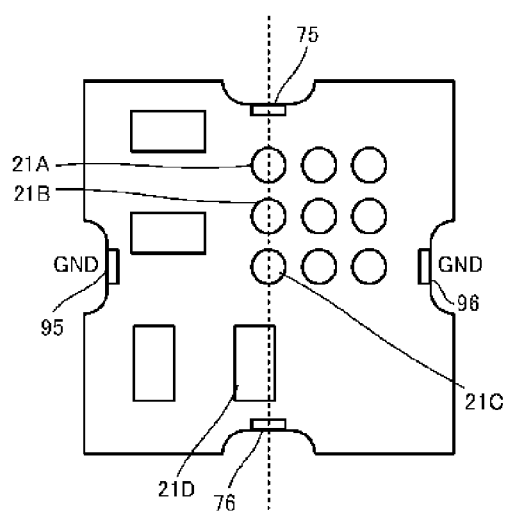
Figure 4:
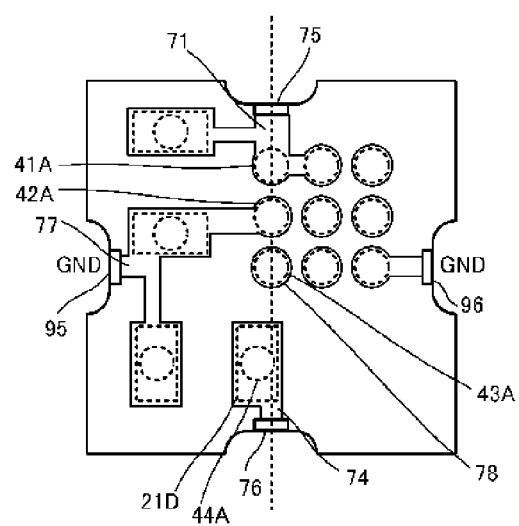
Figure 4:
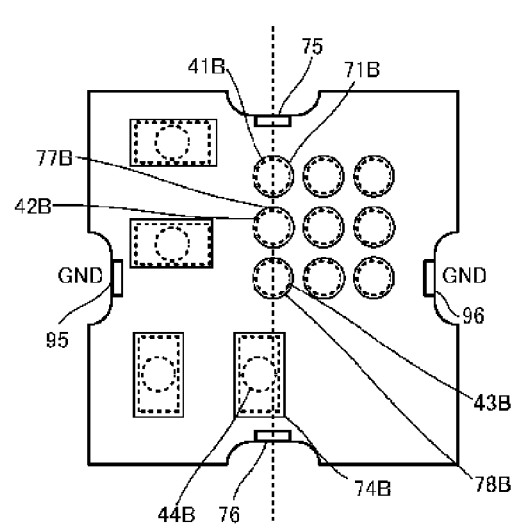
Figure 5:
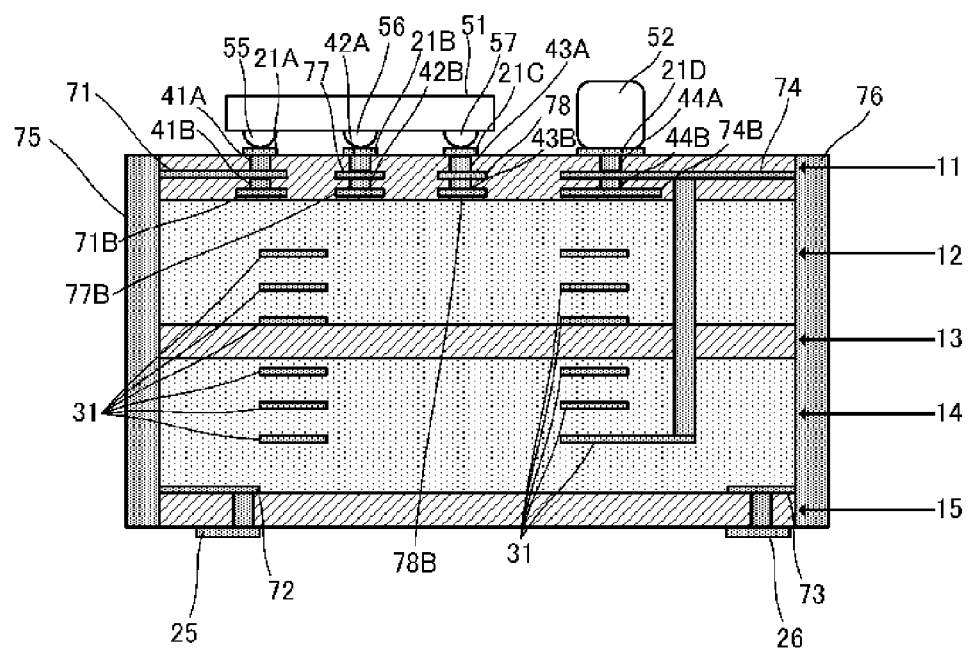
FIG. 5 is a vertical sectional view of the DC-DC converter in the case where electrode pads are provided on a further-lower layer.

FIG. 4A, FIG. 4B, and FIG. 4C are plan views similar to those in FIG. 1A, FIG. 1B, and FIG. 1C. FIG. 4D is a plan view of a third layer. FIG. 5 is a diagram schematically illustrating the vertical cross-sectional structure of the DC-DC converter in the example illustrated in FIGS. 4A to 4D. Other configurations common to those in FIGS. 1A-1C and FIG. 2 are denoted by the same reference symbols and descriptions thereof are omitted.

In this example, an electrode pad 71B, which is electrically connected to the electrode pad 71 through a via hole 41B, is arranged on a layer (third layer) further below the electrode pad 71. Similarly, an electrode pad 77B, which is electrically connected to the electrode pad 77 through a via hole 42B, is arranged on a layer further below the electrode pad 77, an electrode pad 78B, which is electrically connected to the electrode pad 78 through a via hole 43B, is arranged on a layer further below the electrode pad 78, and an electrode pad 74B, which is electrically connected to the electrode pad 74 through a via hole 44B, is arranged on a layer further below the electrode pad 74.

In other words, the electrode pads arranged on the third layer have areas similar to those of the corresponding electrodes pads arranged on the second layer, and have larger areas than areas of the corresponding electrode pads formed on the outermost layer (first layer).

Also, in this case, stress generated in the outermost ceramic green sheet is alleviated and generation of cracks is prevented. In particular, in the case where electrode pads are formed on a plurality of layers, the larger the number of electrode pads with the same area in the stacking direction, the larger the probability of strong stress being generated in the outermost ceramic green sheet. Hence, a large advantage is obtained by arranging electrode pads with different areas, thereby making the stress be dispersed.

Note that providing a plurality of electrode pads on the inner layers makes it possible to employ a configuration in which at least an electrode pad provided on a certain layer has an area different from that of an electrode pad on the outermost layer. For example, as illustrated in FIG. 6A, stress is prevented from concentrating at the outermost ceramic green sheet by dispersing the locations where the stress is generated also in the case where the areas of the electrode pads (the electrode pad 71B, the electrode pad 77B, the electrode pad 78B, and the electrode pad 74B) arranged on the third layer are larger than the areas of the corresponding electrode pads (the component mounting electrode pad 21A, the component mounting electrode pad 21B, the component mounting electrode pad 21C, and the component mounting electrode pad 21D) arranged on the first layer and the electrode pads arranged on the first layer have similar areas to the corresponding electrode pads (the electrode pad 71, the electrode pad 77, the electrode pad 78, and the electrode pad 74) arranged on the second layer.

Figure 6:
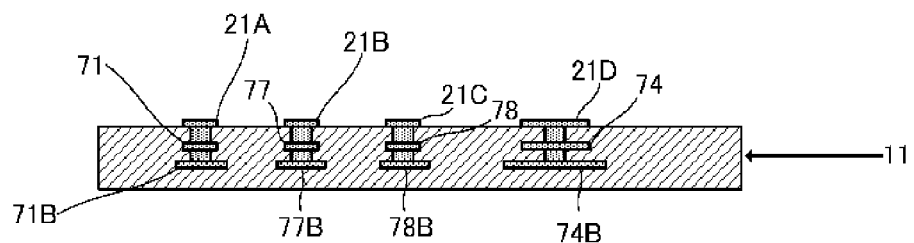
FIGS. 6A-6C are diagrams illustrating an example in which an electrode pad provided on a layer on the inner layer side is different from an electrode pad on the outermost layer.
Figure 6:
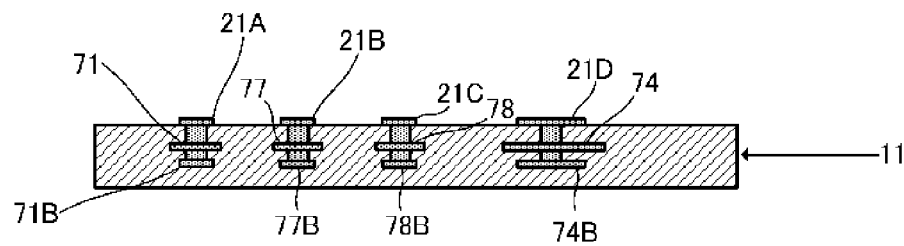
Figure 6:
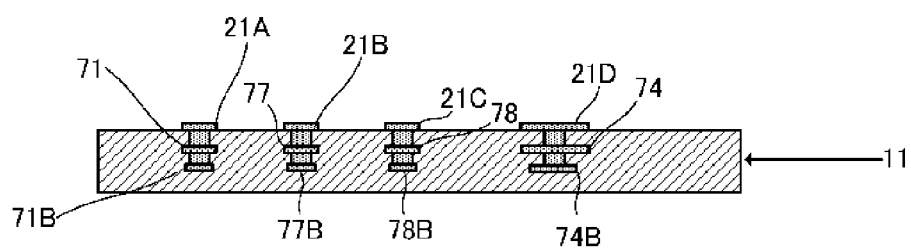

Further, as illustrated in FIG. 6B, stress is prevented from concentrating at the outermost ceramic green sheet by dispersing the locations where the stress is generated also in the case where the areas of the electrode pads arranged on the second layer are larger than those of the corresponding electrode pads arranged on the first layer and the electrode pads arranged on the first layer have areas similar to the areas of the corresponding electrode pads arranged on the third layer.

Further, as illustrated in FIG. 6C, stress is prevented from concentrating at the outermost ceramic green sheet by dispersing the locations where the stress is generated also in the case where the areas of the electrode pads arranged on the third layer are smaller than those of the corresponding electrode pads arranged on the first layer and the electrode pads arranged on the first layer have areas similar to those of the corresponding electrode pads arranged on the second layer.

Note that the examples described above illustrate cases in which the areas of the electrode pads for mounting electronic components, such as ICs, are different from those of the corresponding electrode pads on lower layers. However, when the multilayer substrate is an electronic component module, an example case may be a case in which the areas of the mounting electrode pads to be connected to the mounting-substrate-side land electrodes or the like to which the electronic component module is to be mounted are different from the areas of corresponding electrode pads on an upper layer.

Figure 7:
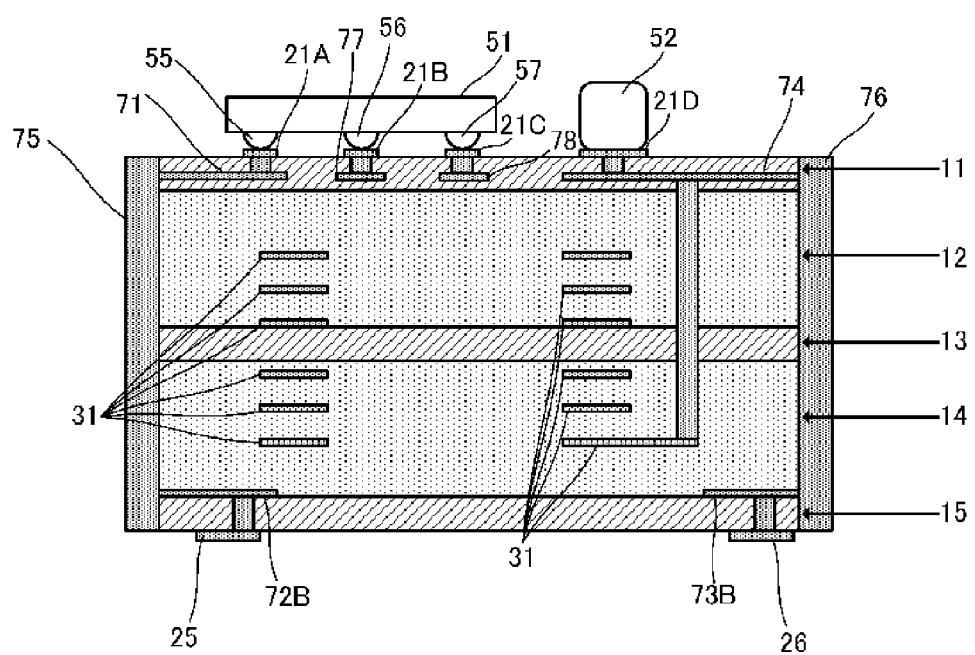
FIG. 7 is a diagram illustrating the case where a mounting electrode pad has an area different from an area of an electrode pad on an upper layer.

For example, in a multilayer substrate illustrated in FIG. 7, an electrode pad 72B arranged on a layer above the input electrode pad 25 on the bottom-surface-side outermost layer has a larger area than an area of the input electrode pad 25, and an area of an electrode pad 73B arranged on a layer above the output electrode pad 26 on the bottom-surface-side outermost layer has a larger area than an area of the output electrode pad 26.

Also in this case, stress generated in the ceramic green sheet of the outermost layer (the lowermost surface in this case) is alleviated and generation of cracks is prevented more than in the case where electrode pads on the outermost layer have the same areas as corresponding electrode pads on an inner layer.

Note that in the embodiments described above, a non-magnetic ferrite material has been shown as a ceramic green sheet arranged at the outermost layer. However, also in the case where a magnetic ferrite material is arranged, stress caused by the difference in the coefficients of linear expansion is similarly generated by a heating process. Hence, by making the positions of the end portions of electrode pads be spaced apart from each other by making the electrode pad on the outermost layer has an area different from an area of the electrode pad on an inner layer, the positions at which stress is generated can be dispersed thereby preventing the stress from concentrating at a single location.

Further, the case where a dielectric material is arranged at the outermost layer is similar to the case described above. However, a ferrite material, in particular, is rigid and cracks are likely to be generated. Hence, the multilayer substrate of the present invention is advantageous in the case where the outermost ceramic green sheet is made of a ferrite material.

REFERENCE SIGNS LIST 11, 13, 15 non-magnetic ferrite layers
12, 14 magnetic ferrite layers
21A, 21B, 21C, 21D component mounting electrode pads
25 input electrode pad
26 output electrode pad
31 electrode pattern
51 control IC
52 output-side capacitor
55 input terminal
56 ground terminal
57 output terminal
71, 72, 73, 74, 77, 78 electrode pads
75, 76, 95, 96 edge surface through-holes

The invention claimed is:

1. A multilayer substrate comprising:
a plurality of ceramic green sheets;
via holes formed by filling through-holes provided in the ceramic green sheets with conductive paste; and
electrode pads formed on the plurality of ceramic green sheets,
wherein the multilayer substrate is formed by stacking the plurality of ceramic green sheets on top of one another and by firing the plurality of ceramic green sheets together in a state in which some of the electrode pads are electrically connected to one another through some of the via holes, and
wherein among the electrode pads electrically connected to one another through some of the via holes, an electrode pad provided on an outermost layer of the multilayer substrate has an area different from an area of an electrode pad provided on an inner layer of the multilayer substrate.

2. The multilayer substrate according to claim 1, wherein the electrode pad provided on the inner layer of the multilayer substrate has a larger area than the area of the electrode pad provided on the outermost layer of the multilayer substrate.

3. The multilayer substrate according to claim 2,
wherein a plurality of the electrode pads are provided on inner layers of the multilayer substrate,
wherein among the plurality of electrode pads provided on the inner layers, at least an electrode pad provided on one of the inner layers has an area that is different from an area of the electrode pad provided on the outermost layer of the multilayer substrate.

4. The multilayer substrate according to claim 2, wherein the electrode pad provided on the outermost layer of the multilayer substrate is an electrode pad for mounting an electronic component.

5. The multilayer substrate according to claim 2, wherein the ceramic green sheet arranged on the outermost layer of the multilayer substrate is made of a ferrite material.

6. The multilayer substrate according to claim 1,
wherein a plurality of the electrode pads are provided on inner layers of the multilayer substrate,
wherein among the plurality of electrode pads provided on the inner layers, at least an electrode pad provided on one of the inner layers has an area that is different from an area of the electrode pad provided on the outermost layer of the multilayer substrate.

7. The multilayer substrate according to claim 6, wherein the electrode pad provided on the outermost layer of the multilayer substrate is an electrode pad for mounting an electronic component.

8. The multilayer substrate according to claim 6, wherein the ceramic green sheet arranged on the outermost layer of the multilayer substrate is made of a ferrite material.

9. The multilayer substrate according to claim 1, wherein the electrode pad provided on the outermost layer of the multilayer substrate is an electrode pad for mounting an electronic component.

10. The multilayer substrate according to claim 9, wherein the ceramic green sheet arranged on the outermost layer of the multilayer substrate is made of a ferrite material.

11. The multilayer substrate according to claim 1, wherein the ceramic green sheet arranged on the outermost layer of the multilayer substrate is made of a ferrite material.

* * * * *